(12) United States Patent
Malik et al.

(10) Patent No.: US 8,802,346 B2
(45) Date of Patent: Aug. 12, 2014

(54) METAL COMPOSITIONS AND METHODS OF MAKING SAME

(75) Inventors: Mangala Malik, Attleboro, MA (US); Joseph J Schwab, Hattiesburg, MS (US)

(73) Assignee: Pryog, LLC, Attleboro, MA (US)

( * ) Notice: Subject to any disclaimer, the term of this patent is extended or adjusted under 35 U.S.C. 154(b) by 561 days.

(21) Appl. No.: 12/737,694

(22) PCT Filed: Jun. 27, 2009

(86) PCT No.: PCT/US2009/003841
§ 371 (c)(1),
(2), (4) Date: Apr. 15, 2011

(87) PCT Pub. No.: WO2010/059174
PCT Pub. Date: May 27, 2010

(65) Prior Publication Data
US 2011/0184139 A1    Jul. 28, 2011

Related U.S. Application Data

(60) Provisional application No. 61/188,182, filed on Aug. 7, 2008.

(51) Int. Cl.
*G03F 7/00* (2006.01)
*C23C 18/14* (2006.01)
*C23C 18/06* (2006.01)
*H05K 3/10* (2006.01)

(52) U.S. Cl.
CPC .................. *C23C 18/14* (2013.01); *C23C 18/06* (2013.01); *H05K 3/105* (2013.01)
USPC .......................................................... 430/269

(58) Field of Classification Search
USPC .................................. 430/269, 322; 526/240
See application file for complete search history.

(56) References Cited

U.S. PATENT DOCUMENTS

| | | | |
|---|---|---|---|
| 2,502,411 A | 4/1950 | Neher et al. | |
| 3,264,272 A | 8/1966 | Rees | |
| 3,379,702 A | 4/1968 | Spivey | |
| 3,672,942 A | 6/1972 | Neumann et al. | |
| 3,705,137 A | 12/1972 | Kuwahara et al. | |
| 4,022,960 A | 5/1977 | Mima et al. | |
| 4,129,524 A | 12/1978 | Nagai et al. | |
| 4,429,094 A * | 1/1984 | Massucco | 526/240 |
| 4,585,841 A | 4/1986 | Eguchi et al. | |
| 4,608,409 A | 8/1986 | Coady et al. | |
| 5,064,877 A | 11/1991 | Nass et al. | |
| 5,159,035 A | 10/1992 | Evani | |
| 5,484,867 A | 1/1996 | Lichtenhan et al. | |
| 5,559,200 A | 9/1996 | Suzuki et al. | |
| 5,664,041 A | 9/1997 | Szum | |
| 5,856,415 A | 1/1999 | Lagace et al. | |
| 6,194,504 B1 | 2/2001 | Nagel et al. | |
| 6,291,070 B1 | 9/2001 | Arpac et al. | |
| 6,432,526 B1 | 8/2002 | Arney et al. | |
| 6,553,169 B2 | 4/2003 | Fabian | |
| 6,656,990 B2 | 12/2003 | Shustack et al. | |
| 6,844,950 B2 | 1/2005 | Ja Chisholm et al. | |
| 6,846,572 B2 | 1/2005 | Yamaguchi et al. | |
| 7,083,831 B1 | 8/2006 | Koch et al. | |
| 2002/0037481 A1 * | 3/2002 | Lee et al. | 430/396 |
| 2002/0082323 A1 | 6/2002 | Chawla et al. | |
| 2003/0059544 A1 | 3/2003 | Bravo-Vasquez et al. | |
| 2003/0073042 A1 | 4/2003 | Cernigliaro et al. | |
| 2004/0026258 A1 * | 2/2004 | No et al. | 205/159 |
| 2004/0164293 A1 | 8/2004 | Maloney et al. | |
| 2004/0171743 A1 | 9/2004 | Flaim et al. | |
| 2005/0131175 A1 | 6/2005 | Weck et al. | |
| 2007/0075628 A1 | 4/2007 | Lewis et al. | |
| 2007/0287747 A1 | 12/2007 | Finmans et al. | |
| 2008/0083299 A1 | 4/2008 | Simone et al. | |
| 2008/0150184 A1 | 6/2008 | Chiruvolu et al. | |

OTHER PUBLICATIONS

E. Bryan Coughlin, "Silsesquioxane based Inorganic Organic Hybrid Copolymers", 2005.
"Brewer Science Offers Novel High Refractive Index Polymers"—www.brewerscience.com, 2005.
Yubao Wang et al., "Hybrid high refractive index polymer coatings", 2005.
Henry W. Oviatt, "Polyhedral Oligomeric SilSesquioxane (POSS) Fillers as Refractive Index Enhancers for Silicone Intraocular Lenses, 18-9333", 2002.
D. Skrtic et al., "Dental composites based on hybrid and surface-modified amorphous calcium phosphates", Biomaterials 25 (2004), pp. 1141-1150.
D. Skrtic et al., "Volumetric contraction and methacrylate conversion in photo-polymerized amorphous calcium phosphate/methacrylate composites", Biomaterials 24 (2003).
Schubert et al., "Inorganic-Organic Hybrid Polymers from Surface-Modified Oxometallate Clusters", Mat. Res. Soc. Symp. Proc. (2000) vol. 628, CC2.3.1-CC2.3.11.
International Search Report for International Application No. PCT/US05/44670 dated Jun. 26, 2006.
International Search Report for International Application No. PCT/US06/22885 dated Feb. 12, 2008.
International Search Report for International Application No. PCT/US09/03841 dated Nov. 13, 2009.

* cited by examiner

*Primary Examiner* — Brittany Raymond
(74) *Attorney, Agent, or Firm* — Alix, Yale & Ristas, LLP

(57) ABSTRACT

The present invention relates to a process for forming metal-containing films by applying a photosensitive metal-containing composition on a substrate, drying the photosensitive metal-containing composition, exposing the photosensitive metal-containing composition to a source of actinic radiation and applying a post-treatment to the metal-containing composition. The process also includes exposing the photosensitive metal-containing composition to a source of actinic radiation through a mask or mold and developing the unexposed portion of the composition. Another embodiment of the invention is a metal-containing film, three-dimensional object or article formed by the process. The invention is useful in producing a directly patterned metal-containing film and a microdevice.

32 Claims, No Drawings

METAL COMPOSITIONS AND METHODS OF MAKING SAME

RELATED APPLICATIONS

This application claims priority based upon U.S. Provisional Application No. 61/188,182, filed Aug. 7, 2008, copending U.S. patent application Ser. No. 11/792,738, filed Jun. 12, 2007, which claims priority from PCT/US05/44670 filed Dec. 9, 2005, which in turn claims priority from U.S. Provisional Application No. 60/634,890 filed Dec. 13, 2004, and copending U.S. patent application Ser. No. 11/792,739, filed Jun. 12, 2007, which claims priority from PCT/US06/22885 filed Jun. 12, 2006.

FIELD

The disclosed embodiments relate to methods of making metal-containing films, three-dimensional objects or articles via photochemical reactions.

BACKGROUND

Conventional methods of patterning into metal-based substrates involve complex multi-step processes including deposition of the nascent metal-compounds on suitable substrates and patterning into such compounds.

Techniques commonly employed to deposit metals or metal oxides are spin-on deposition of metal precursor (sol-gel), evaporation, sputtering, and chemical vapor deposition (CVD). Each of these techniques has several limitations and hence has limited commercial viability.

Sol-gel is one of the most common methods of depositing a metal oxide layer. The method employs spin-on coating of a sol precursor dissolved in a suitable solvent followed by heating the substrate to a high temperature to convert the precursor film into metal oxide. The method is not very practical in the sense that it employs quite high temperatures. High stresses related to cycles of heating and cooling involved in the process lead to defectivity. Moreover, additional processing steps are required to pattern small features into the material.

Deposition by evaporation involves heating of metal-compound to be deposited to high temperatures. Vapors of such materials are condensed on the substrate under vacuum using a screen or shadow to form fine patterns of the material. Deposition by evaporation has limited commercial potential due to high temperatures and high vacuum requirements.

Deposition by sputtering involves vaporization of the material to be deposited by bombarding with high-energy atomic radiation. Similar to Evaporation, the vapors of the materials can be deposited on the substrate by condensation. Utility of the process is limited due to high energy requirements and lack of precision in controlling film properties.

The process of deposition by CVD is even more expensive than sputtering or evaporation due to additional costs associated with the specialized equipment required for the chemical reactions prior to material deposition.

Formation of fine patterns into such metal-containing layers is achieved by additional multiple steps of imaging and etching of a photosensitive film deposited on such materials. First a photoresist or photosensitive film is applied on the metal-containing layer and dried at an appropriate temperature to remove a majority of casting solvent followed by image-wise exposure to actinic radiation to which such photoresist material is sensitive. In case of a positive acting photoresist, the exposed area of the film undergoes chemical reaction rendering it soluble in an alkaline developer. The action of developer leaves behind a fine pattern of the photoresist material. In the case of a negative acting photoresist, the exposed portion of the film undergo chemical reaction rendering it insoluble in a solvent suitable for removing unexposed area of the film, leaving behind a fine pattern of the photoresist film, which acts as an etch mask to transfer pattern into underlying metal-containing material.

Another method of forming fine patterns involves depositing a non-photosensitive metal-containing film, into a patterned substrate. The non-photosensitive metal-containing film is etched back to resolve the underlying pattern.

The techniques of metal-compound deposition as well as patterning are cumbersome and expensive. Ultra high purity materials are required for successful deposition. Moreover, the resolution of the pattern formed by some of the techniques is quite limited. Therefore, methods involving direct patterning into metal-containing layers are desired.

A photoresist-free, negative-tone method of direct patterning into metal-containing materials is described in U.S. Pat. Nos. 5,534,312; 6,071,676 and 6,972,256. The metal complex used in the method is photosensitive and undergoes low-temperature reaction in the presence of light of particular wavelength rendering the exposed portion insoluble in solvent/developer. Disadvantages of this method include limited choices of the starting metal-containing materials which demonstrate a sharp switch in solubility behavior upon exposure requiring very high exposure doses and often treatment of harsh solvents to remove unconverted material. Such harsh solvents also attack the exposed area, destroying pattern fidelity. This technique involves metal compounds that show significant absorbance at the exposure wavelength. High absorbance at the film surface leads to less light penetration into the bulk of the film resulting in non-uniform photochemical reaction; hence, chemical composition of the film is quite heterogeneous across the film.

More recently, Hill et al in U.S. Pat. No. 7,176,114, describe positive-tone pattern formation into metal-containing precursor layers. Materials used in the positive-tone method show sharper solubility contrast between the exposed and un-exposed areas of the film. However, most of the disadvantages noted with the negative tone-methods such as requirement of high energy dose and high exposure times make this method less pragmatic for real production environment.

SUMMARY

An objective of the embodiments disclosed herein is to provide a process of forming metal-containing films, three dimensional objects or articles. The metal compounds of the disclosed embodiments are readily soluble in commonly used solvents for coating applications and can be applied conveniently by any known coating method. The metal compounds used in the disclosed embodiments are generally transparent at the exposure wavelength, leading to a more efficient photochemical reaction. Photosensitivity to such metal-containing compositions is predominantly imparted and controlled by adding a photoactive compound that acts as a photoinitiator or photoactive catalyst. Through the use of a post-treatment, the metal-containing film composition can be tuned. The process described herein is also useful in directly applying high dielectric constant (k) materials such as hafnium- and zirconium-based metal compositions. Thus it is possible to replace silicon dioxide (k of about 4) with a high-k material such as hafnium or zirconium oxide gates using a convenient and low-cost process described herein.

Another objective of the embodiments disclosed herein is to provide a process of forming direct patterning of metal compounds using photosensitive compositions. Moreover, the patterning process of the embodiments described herein utilizes well known techniques of lithography, amenable to high throughput manufacturing. Through the use of a post-treatment, the patterned metal-containing film composition can be tuned as well as the refractive index. The process described herein is also useful in directly patterning high dielectric constant (k) materials such as hafnium- and zirconium-based metal compositions. Thus it is possible to replace silicon dioxide (k of about 4) with a high-k material such as hafnium or zirconium oxide gates using a convenient and low-cost process described herein.

Another objective of the disclosed embodiments is to provide a process for the production of metal-containing patterned films and three-dimensional objects or articles for protective, insulating and antireflective properties.

One embodiment is a process for forming a metal-containing film by applying a photosensitive metal-containing composition on a substrate, drying the photosensitive metal-containing composition, exposing the photosensitive metal-containing composition to a source of actinic radiation, and applying a post-treatment to the metal-containing composition. The photosensitive metal-containing composition comprises:
  i. a metal-containing precursor unit (MU) containing at least two reactive functional groups, and
  ii. a photoinitiator or photoactive catalyst
where MU is represented by Structure I:

       Structure I where M comprises a metal with a formal valency of 0-7 and is selected from Zr, Hf, Ge, Ti, Pb, Gd, Sn, Zn, Ni, Ce, Nb, Eu, In, Al, Fe, Mn, Nd, Cu, Sb, Mg, Ga, Se, Cd, Ta, Co, Cr, Pt, Au, W, V, Tl, Te, Sr, Sm, La, Er, Pd, In, Ca, Ba, As and Y; Ligand A contains a reactive functional group capable of undergoing a combining reaction; w is 2 to 7; Ligands B and C are selected individually or in combination from oxygen, nitrogen, sulfur, or a halogen atom; linear, branched or cyclic alkyl, alkenyl or alkynyl group; substituted or unsubstituted aryl group; and —$XR^1$ where X represents an organic functional group such as oxy, thio, carboxy, thiocarboxy, sulfo, oxalate, acetoacetonate, carbanion, carbonyl, thiocarbonyl, cyano, nitro, nitrito, nitrate, nitrosyl, azide, cyanato, isocyanato, thiocyanato, isothiocyanato, amido, amine, diamine, arsine, diarsine, phosphine, and diphosphine, and $R^1$ represents a linear, branched or cyclic alkyl or thioalkyl group, a heterocyclic group, an alicyclic group, and a substituted or unsubstituted aryl or heteroaryl group; and x and y are 0 to 5.

Optionally, additional steps in the process allow for forming patterned metal-containing films, three-dimensional objects or articles. The process with additional steps comprise applying a photosensitive metal-containing composition on a substrate, drying the photosensitive metal-containing composition, exposing the photosensitive metal-containing composition to a source of actinic radiation through a mask or mold, developing the unexposed portion of the composition and applying a post-treatment to the metal-containing composition.

Another embodiment is a metal-containing film comprising $M_zE_v$ where M comprises a metal with a formal valency of 0-7 and is selected from Zr, Hf, Ge, Ti, Pb, Gd, Sn, Zn, Ni, Ce, Nb, Eu, In, Al, Fe, Mn, Nd, Cu, Sb, Mg, Ga, Se, Cd, Ta, Co, Cr, Pt, Au, W, V, Tl, Te, Sr, Sm, La, Er, Pd, In, Ca, Ba, As and Y; E is selected individually or in combination from a group of elements such as oxygen, hydrogen, nitrogen, sulfur, carbon, silicon or fluorine; and z is about 5 to about 95% and z+v is 100%. The metal-containing film is formed by applying a photosensitive metal-containing composition on a substrate wherein the photosensitive metal-containing composition comprises: a metal-containing precursor unit (MU) containing at least two reactive functional groups, and a photoinitiator or photoactive catalyst, where MU is represented by Structure I shown above, drying the photosensitive metal-containing composition, exposing the photosensitive metal-containing composition to a source of actinic radiation and applying a post-treatment to the metal-containing composition.

A further embodiment is a directly patterned metal-containing film comprising $M_zE_v$ where M comprises a metal with a formal valency of 0-7 and is selected from Zr, Hf, Ge, Ti, Pb, Gd, Sn, Zn, Ni, Ce, Nb, Eu, In, Al, Fe, Mn, Nd, Cu, Sb, Mg, Ga, Se, Cd, Ta, Co, Cr, Pt, Au, W, V, Tl, Te, Sr, Sm, La, Er, Pd, In, Ca, Ba, As and Y; E is selected individually or in combination from a group of elements such as oxygen, hydrogen, nitrogen, sulfur, carbon, silicon or fluorine; where z is about 5 to about 95% and z+v is 100%.

Yet another embodiment is a microdevice comprising a substrate and a patterned layer comprising $M_zE_v$, where M comprises a metal with a formal valency of 0-7 and is selected from Zr, Hf, Ge, Ti, Pb, Gd, Sn, Zn, Ni, Ce, Nb, Eu, In, Al, Fe, Mn, Nd, Cu, Sb, Mg, Ga, Se, Cd, Ta, Co, Cr, Pt, Au, W, V, Tl, Te, Sr, Sm, La, Er, Pd, In, Ca, Ba, As and y; E is selected individually or in combination from a group of elements such as oxygen, hydrogen, nitrogen, sulfur, carbon, silicon or fluorine; where z is about 5 to about 95% and z+v is 100% and $M_zE_v$ is formed from an irradiated post-treated photosensitive metal-containing composition wherein the photosensitive metal-containing composition comprises a combination of metal-containing precursor units (MU) containing at least two reactive functional groups and a photoinitiator or photoactive catalyst, where MU is represented by Structure I shown above.

Further scope of the disclosed embodiments will become apparent from the detailed description given hereinafter. However, it should be understood that the detailed description and specific examples, while indicating preferred embodiments, are given by way of illustration only, since various changes and modifications within the spirit and scope of the invention will become apparent to those skilled in the art from this detailed description.

DETAILED DESCRIPTION

Definitions of Terms Used

The term "combining reaction" as used herein refers to polymerization and/or crosslinking reactions of reactive functional groups.

The term "reactive functional group" as used herein refers to functional groups such as epoxide, —SiH, a —SH group and ethylenically unsaturated functional groups such as a vinyl group, an allyl group, a (meth)acryloyl group. Combining reactions include reactions of ethylenically unsaturated functional groups, reactions involving ethylenically unsaturated functional groups with a —SiH group or a —SH group and reactions involving epoxides. The crosslinking is usually chemical crosslinking but in some cases can be physical crosslinking. Combining reactions can take place with MU and MU and with MU and various components.

The term "ligand" as used herein refers to molecules, ions or atoms attached to the central atom of a coordination compound, a chelate or other complex.

The term "compatible" as used herein refers to a homogeneous film which does not show precipitation or phase separation.

The prefix "(meth)acryl" as used herein refers to either an acryl or a methacryl group.

As used herein, "post-treatment" is a treatment selected individually or in combination from thermal, source of high energy ion beam, chemical, or plasma which alters the chemical composition of the resulting metal-containing film.

As used herein, "microdevices" are devices made using microfabrication technologies. Non-limiting examples of microtechnologies include integrated circuits, microsensors, inlet nozzles, flat panel displays and laser diodes.

In the first embodiment a process is provided for producing metal-containing films, three-dimensional objects or articles via photochemical reactions of suitable photosensitive metal-containing compositions. The process comprises applying the photosensitive metal-containing compositions on to a substrate, drying the photosensitive metal-containing composition, sometimes at a temperature between 40 and 200° C. and exposing the photosensitive metal-containing composition to actinic radiation. The process further comprises applying a post-treatment selected individually or in combination from a thermal, chemical or plasma treatment producing metal-containing films, three-dimensional objects or articles comprising $M_zE_v$, where M comprises a metal with a formal valency of 0-7 and is selected from Zr, Hf, Ge, Ti, Pb, Gd, Sn, Zn, Ni, Ce, Nb, Eu, In, Al, Fe, Mn, Nd, Cu, Sb, Mg, Ga, Se, Cd, Ta, Co, Cr, Pt, Au, W, V, Tl, Te, Sr, Sm, La, Er, Pd, In, Ca, Ba, As and Y; E is selected individually or in combination from a group of elements such as oxygen, hydrogen, nitrogen, sulfur, carbon, silicon or fluorine; where z is about 5 to about 95%, or about 15% to about 95%, or about 25% to about 95% and z+v is 100%. The process further comprises producing metal-containing films, three-dimensional objects or articles producing metal-containing films, three-dimensional objects or articles with index of refraction in the range of 1.4 to 2.2 in the 400-900 nm range of light and 1.4 to 2.4 in the 150-400 nm range of light. The process also provides metal-containing films, three-dimensional objects or articles with dielectric constant of at least 2.

In the second embodiment, a process for producing patterned metal-containing films, three-dimensional objects or articles via photochemical reactions of suitable photosensitive metal-containing compositions is described. The process comprises applying the photosensitive metal-containing compositions on to a substrate, drying the photosensitive metal-containing composition, sometimes at a temperature between 40 and 200° C. for about a few seconds to a few minutes, exposing the photosensitive metal-containing composition to actinic radiation through an appropriate photomask and developing away the unexposed region of the composition. The process further comprises applying a post-treatment selected individually or in combination from a thermal, chemical or plasma treatment producing metal-containing films, three-dimensional objects or articles comprising MzEv, where M comprises a metal with a formal valency of 0-7 and is selected from Zr, Hf, Ge, Ti, Pb, Gd, Sn, Zn, Ni, Ce, Nb, Eu, In, Al, Fe, Mn, Nd, Cu, Sb, Mg, Ga, Se, Cd, Ta, Co, Cr, Pt, Au, W, V, Tl, Te, Sr, Sm, La, Er, Pd, In, Ca, Ba, As and Y; E is selected individually or in combination from a group of elements such as oxygen, hydrogen, nitrogen, sulfur, carbon, silicon or fluorine; where z is about 5 to about 95% and z+v is 100%. The process further comprises producing metal-containing films, three-dimensional objects or articles with index of refraction in the range of 1.4 to 2.2 in the 400-900 nm range of light and 1.4 to 2.4 in the 150-400 nm range of light. The process also provides metal-containing films, three-dimensional objects or articles with dielectric constant of at least 2.

An alternative process for producing patterned metal-containing films comprises applying photosensitive metal-containing composition on to a substrate, imprinting the photosensitive metal-containing composition with a template, which could be in the form of a stamp or a dye or a mold, exposing the imprinted photosensitive metal-containing composition to actinic radiation in the form of light or heat. The process is referenced as 'imprint lithography'. The metal-containing composition used for imprint lithography is not necessarily photosensitive and heat can be used to induce combining reaction resulting in change of solubility behavior of the imprinted composition before and after heating. A thermally activated initiator or catalyst as an essential part of the metal-containing composition. Imprint lithography can also be performed using a photosensitive metal-containing composition, where a photoinitiator or a photoactive catalyst is used. The template used in the process may be transparent to the actinic light in order to expose the composition before removing the template. The process further comprises applying a post-treatment selected individually or in combination from a thermal, chemical or plasma treatment producing metal-containing films, three-dimensional objects or articles comprising MzEv, where M comprises a metal with a formal valency of 0-7 and is selected from Zr, Hf, Ge, Ti, Pb, Gd, Sn, Zn, Ni, Ce, Nb, Eu, In, Al, Fe, Mn, Nd, Cu, Sb, Mg, Ga, Se, Cd, Ta, Co, Cr, Pt, Au, W, V, Tl, Te, Sr, Sm, La, Er, Pd, In, Ca, Ba, As and Y; E is selected individually or in combination from a group of elements such as oxygen, hydrogen, nitrogen, sulfur, carbon, silicon or fluorine; where z is about 5 to about 95% and z+v is 100%. The process further comprises for producing metal-containing films, three-dimensional objects or articles with index of refraction in the range of 1.4 to 2.2 in the 400-900 nm range of light and 1.4 to 2.4 in the 150-400 nm range of light. The process also provides metal-containing films, three-dimensional objects or articles with dielectric constant of at least 2. A general description of imprint technology is described in U.S. Pat. Nos. 5,772,905 and 6,334,960 and are incorporated herein as reference.

The photosensitive metal-containing composition in the above embodiments comprises a metal-containing precursor unit (MU) and a photoactive catalyst or a photoinitiator. The photoactive catalyst or photoinitiator absorbs significant portion of the actinic light and is capable of inducing combining reactions in MU so that the composition becomes insoluble to solvent or developer employed in the subsequent step of developing away the unexposed portion of the composition. The MU contains at least two reactive functional groups capable of undergoing combining reactions induced by the photoactive catalyst or photoinitiator when exposed to actinic source of light. MU is represented by Structure I:

$$MA_wB_xC_y$$ <span style="float:right">Structure I</span> where M comprises a metal with formal valency of 0-7 such as Zr, Hf, Ge, Ti, Pb, Gd, Sn, Zn, Ni, Ce, Nb, Eu, In, Al, Fe, Mn, Nd, Cu, Sb, Mg, Ga, Se, Cd, Ta, Co, Cr, Pt, Au, W, V, Tl, Te, Sr, Sm, La, Er, Pd, In, Ca, Ba, As and Y;

Ligand A contains a reactive functional group capable of undergoing a combining reaction in the presence of a suitable photoinitiator or photoactive catalyst typically employed in formulating these compositions; w is 2 to 7. Ligand A contains an ethylenically unsaturated functional group such as a (meth)acryloyl, vinyl, allyl, styryl, or cyclic olefinic group or other reactive functional groups such as an epoxide group, a SiH group, and a SH group, which are capable of undergoing a combining reaction with other reactive functional groups of various components. This reaction generally occurs in the presence of a suitable photoinitiator or photoactive catalyst and a source of actinic radiation.

Ligands B and C are selected individually or in combination from oxygen, nitrogen, sulfur, or a halogen atom; linear, branched or cyclic alkyl, alkenyl or alkynyl group; substituted or unsubstituted aryl group; or —XR1 where X represents an organic functional group such as oxy, thio, carboxy, thiocarboxy, sulfo, oxalate, acetoacetonate, carbanion, carbonyl, thiocarbonyl, cyano, nitro, nitrito, nitrate, nitrosyl, azide, cyanato, isocyanato, thiocyanato, isothiocyanato, amido, amine, diamine, arsine, diarsine, phosphine, and diphosphine, and R1 represents a linear, branched or cyclic alkyl or thioalkyl group, a heterocyclic group, an alicyclic group, or a substituted or unsubstituted aryl or heteroaryl group; x and y are 0 to 5. An example of an alkenyl group is ethylene. An example of an alkynyl group is acetylene. Some examples of a carbanion are 2,2-dimethyl-4,6-dioxo-1,3-dioxan-5-ide, dicyanomethanide, cyclopenta-2,4-dienide, and phenylethynide.

In examples where a dielectric constant (k) greater than 2 is required, the metal-containing precursor (MU) contains high k metals such as zirconium and hafnium.

Ligands A, B and C are chosen to control absorbance and refractive index, control morphology, and no portion of the ligand may interfere in the reactivity of the reactive functional group of Ligand A. Ligands A, B and C are selected to impart solubility in a variety of organic solvents commonly used in coating formulations and to impart compatibility with other ingredients used in the preparation of the photosensitive metal-containing composition. The groups may also be chosen to facilitate decomposition during the thermal/plasma treatment stage of the process.

Ligands A, B and C can also play role in controlling important functional properties such as adhesion to a variety of substrates, viscosity, mechanical and thermal properties of the film formed from the photosensitive metal-containing composition. For instance, it is important to choose functional groups that do not absorb significant portion of radiation to ensure uniform photoreaction throughout the composition. Similarly, thermal decomposition temperature of the material can be modified by choosing appropriate functional groups. Also the mechanical properties of the film can be tailored via appropriate selection of the functional groups.

Specific examples of Ligand A are (meth)acrylate, 2-carboxyethyl acrylate, vinyl acetate, 3-butenoate, 4-pentenoate, vinyl sulfonate, styrene sulfonate, vinylphenolate, vinyl benzoate, bicyclo[2.2.1]hept-5-ene-2-carboxylate, 2-ethoxy(meth)acrylate, 2-ethoxyvinylacetate, 3-(2,2-dimethoxypropoxy)(meth)acrylate, (meth)acryloxyethylacetoacetate, 2-(acryloxy)-5-oxo-4-oxatricyclo[4.2.1.0$^{3,7}$]nonane-9-carboxylate, 5-(bicyclo[2.2.1]hept-5-en-2-ylthio)bicyclo[2.2.1]heptane-2-carboxylate, oxiran-2-ylmethanolate, oxirane-2-carboxylate, 3-oxatricyclo[3.2.1.0$^{2,4}$]octane-6-carboxylate, 3,8-dioxatricyclo[5.1.0.0$^{2,4}$]octane-5-carboxylate, 7-oxabicyclo[4.1.0]heptane-1-carboxylate, 7-oxabicyclo[4.1.0]heptane-3-carboxylate and (3-phenyloxiran-2-yl)methanolate.

Some non-limiting examples of Ligands B and C are oxygen atom, a sulfur atom, a nitrogen atom, a chlorine atom, methyl, ethyl, ethylene, cyclopentadiene, norbornene, acetylene, methoxy, ethoxy, propoxy, butoxy, isopropoxy, 2-methoxyethoxy, 2-ethylhexoxy, cyclohexanolate, bicyclo[2.2.1]heptan-2-olate, phenoxy, naphthoxy, methanethiolate, ethanethiolate, propanethiolate, butanethiolate, isopropanethiolate, 2-ethylhexanethiolate, cyclohexanethiolate, bicycle[2.2.1]heptanethiolate, benzenethiolate, naphthalenethiolate, acetate, propanoate, butanoate, 2-methyl propanoate, 2-ethylhexanoate, 2-bromo-5-oxo-4-oxatricyclo[4.2.1.0$^{3,7}$]nonane-9-carboxylate, 6-(2-naphthylthio)bicyclo[2.2.1]heptane-2-carboxylate, ethanethioate, propanethioate, butanethioate, 2-methyl propanethioate, 2-ethylhexanethioate, methanesulfonate, ethanesulfonate, propanesulfonate, butanesulfonate, cyclohexanesulfonate, [(1S,4R)-7,7-dimethyl-2-oxobicyclo[2.2.1]hept-1-yl]methanesulfonate, 4-methylbenzenesulfonate, oxalate, acetoacetonate, 1,3-diphenylpropane-1,3-dione, 2,2,6,6-tetramethylheptane-3,5-dione, 2,2-dimethyl-4,6-dioxo-1,3-dioxan-5-ide, dicyanomethanide, cyclopenta-2,4-dienide, phenylethynide, nitromethane, nitroethylene, methyl nitrate, phenyl azide, methyl isocyanate, allyl isothiocyanate, triethylamine, ethylene diamine, triphenyl arsine, triphenyl phosphine, t-butyl phosphine and trimethyl phosphine.

Specific non-limiting examples of metal-containing precursor unit (MU) are zirconium(meth)acrylate, zirconyl di(meth)acrylate, zirconium butoxide(meth)acrylate, zirconium carboxyethyl acrylate, zirconium vinyl acetate, zirconyl di(vinyl acetate), zirconium 3-oxatricyclo[3.2.1.0$^{2,4}$]octane-6-carboxylate, zirconium 2-bromo-5-oxo-4-oxatricyclo[4.2.1.0$^{3,7}$]nonane-9-carboxylate(meth)acrylate, zirconium 6-(2-naphthylthio)bicyclo[2.2.1]heptane-2-carboxylate (meth)acrylate, zirconium [(1S,4R)-7,7-dimethyl-2-oxobicyclo[2.2.1]hept-1-yl]methanesulfonate 2-naphthalenethiolate(meth)acrylate, hafnium(meth)acrylate, hafnium butoxide(meth)acrylate, hafnium oxide di(meth)acrylate, hafnium carboxyethyl acrylate, hafnium vinyl acetate, and hafnium oxide di(vinyl acetate), hafnium 3-oxatricyclo[3.2.1.0$^{2,4}$]octane-6-carboxylate, hafnium 2-bromo-5-oxo-4-oxatricyclo[4.2.1.0$^{3,7}$]nonane-9-carboxylate(meth)acrylate, hafnium 6-(2-naphthylthio)bicyclo[2.2.1]heptane-2-carboxylate(meth)acrylate, hafnium[(1S,4R)-7,7-dimethyl-2-oxobicyclo[2.2.1]hept-1-yl]methanesulfonate 2-naphthalenethiolate(meth)acrylate, titanium(meth)acrylate, titanium butoxide(meth)acrylate, titanium oxide di(meth)acrylate, titanium carboxyethyl acrylate, titanium vinyl acetate, titanium oxide di(vinyl acetate), titanium 3-oxatricyclo[3.2.1.0$^{2,4}$]octane-6-carboxylate, titanium 2-bromo-5-oxo-4-oxatricyclo[4.2.1.0$^{3,7}$]nonane-9-carboxylate(meth)acrylate, titanium 6-(2-naphthylthio)bicyclo[2.2.1]heptane-2-carboxylate (meth)acrylate, titanium[(1S,4R)-7,7-dimethyl-2-oxobicyclo[2.2.1]hept-1-yl]methanesulfonate 2-naphthalenethiolate (meth)acrylate, di-n-butoxydi(meth)acryloxygermane, tetracarboxyethylacryloxygermane, tetravinylacetoxygermane, tetra(meth)acryloxygermane, 3-oxatricyclo[3.2.1.0$^{2,4}$]octane-6-carboxygemane, 2-bromo-5-oxo-4-oxatricyclo[4.2.1.0$^{3,7}$]nonane-9-carboxytri(meth)acryloxygermane, 6-(2-naphthylthio)bicyclo[2.2.1]heptane-2-carboxytri (meth)acryloxygermane, tantalum(meth)acrylate, tantalum butoxide(meth)acrylate, tantalum carboxyethyl acrylate, tantalum vinyl acetate, tantalum 3-oxatricyclo[3.2.1.0$^{2,4}$]octane-6-carboxylate, tantalum 2-bromo-5-oxo-4-oxatricyclo[4.2.1.0$^{3,7}$]nonane-9-carboxylate(meth)acrylate, tantalum 6-(2-naphthylthio)bicyclo[2.2.1]heptane-2-carboxylate (meth)acrylate, aluminum(meth)acrylate, aluminum butoxide(meth)acrylate, aluminum carboxyethyl acrylate, aluminum vinyl acetate, aluminum 3-oxatricyclo[3.2.1.0$^{2,4}$]octane-6-carboxylate, aluminum 2-bromo-5-oxo-4-oxatricyclo[4.2.1.0$^{3,7}$]nonane-9-carboxylate(meth)acrylate, aluminum 6-(2-naphthylthio)bicyclo[2.2.1]heptane-2-carboxylate(meth)acrylate, niobium(meth)acrylate, niobium butoxide(meth)acrylate, niobium carboxyethyl acrylate, niobium vinyl acetate, niobium 3-oxatricyclo[3.2.1.0$^{2,4}$]octane-6-carboxylate, niobium 2-bromo-5-oxo-4-oxatricyclo

[4.2.1.0$^{3,7}$]nonane-9-carboxylate(meth)acrylate and niobium 6-(2-naphthylthio)bicyclo[2.2.1]heptane-2-carboxylate(meth)acrylate.

Other examples of ligands and metal-containing precursor units (MU) are provided in co-pending U.S. patent application Ser. No. 11/792,738 and U.S. patent application Ser. No. 11/792,739.

The photoactive catalyst or photoinitiator used in the composition is a compound that absorbs light at the wavelength of exposure and is capable of catalyzing combining reactions of the MU and/or other various components, when composition or a portion of composition is exposed to light. An example of a free-radical photoinitiator is 1-hydroxy-cyclohexyl-phenyl-ketone, (Irgacure 184) from Ciba Specialty Chemicals. An example of a photoactive catalyst is a photoacid generator such as triphenyl sulfonium triflate from Aldrich Catalog No. 526940.

Specific examples of photoinitiators include but are not limited to 2-hydroxy-2-methyl-1-phenylpropan-1-one, 1-hydroxycyclohexyl phenyl ketone (Irgacure 184 from Ciba Specialty Chemical), a blend of 1-hydroxycyclohexylphenylketone and benzophenone (Irgacure 500 from Ciba Specialty Chemical), 2,4,4-trimethylpentyl phosphine oxide (Irgacure 1800, 1850, and 1700 from Ciba Specialty Chemical), 2,2-dimethoxyl-2-acetophenone (Irgacure 651 from Ciba Specialty Chemical), bis(2,4,6-trimethyl benzoyl)phenyl-phosphine oxide (Irgacure 819 from Ciba Specialty Chemical), 2-methyl-1-[4-(methylthio)phenyl]-2-morphorinopropane-1-on (Irgacure 907), (2,4,6-trimethylbenzoyl)diphenyl phosphine oxide (Lucerin TPO from BASF), ethoxy(2,4,6-trimethylbenzoyl)phenyl phosphine oxide (Lucerin TPO-L from BASF), a blend of phosphine oxide, α-hydroxy ketone and a benzophenone derivative (ESACURE KT046 from Sartomer), 2-hydroxy-2-methyl-1-phenylpropane-1-on (Darocur 1173 from Merck), benzophenone, 2-chlorothioxanthone, 2-methylthioxanthone, 2-isopropylthioxanthone, benzodimethyl ketal, 1,1,1-trichloroacetophenone, diethoxyacetophenone, m-chloroacetophenone, propiophenone, anthraquinone, and dibenzosuberone.

Specific examples of nonionic-type photoactive catalysts are phenacyl p-methylbenzenesulfonate, benzoin p-toluenesulfonate, α-(p-toluene-sulfonyloxy)methylbenzoin, 3-(p-toluenesulfonyloxy)-2-hydroxy-2-phenyl-1-phenylpropyl ether, N-(p-dodecylbenzenesulfonyloxy)-1,8-naphthalimide and N-(phenyl-sulfonyloxy)-1,8-napthalimide, (2Z)-(2-methylphenyl)[(2Z)-2-{[(propylsulfonyl)oxy]imino}thiophen-3(2H)-ylidene]acetonitrile, (2Z)-[(2Z)-2-{[(octylsulfonyl)oxy]imino}thiophen-3(2H)-ylidene](2-methylphenyl)acetonitrile, (2Z)-[(2Z)-2-{R(7,7-dimethyl-2-oxobicyclo[2.2.1]hept-1-yl)methanesulfonyl)oxy]imino}thiophen-3(2H)-ylidene](2-methylphenyl)acetonitrile, (2Z)-[(2Z)-2-{[(4-methylbenzenesulfonyl)oxy]imino}thiophen-3(2H)-ylidene]2-methylphenyl)acetonitrile, (2Z)-(4-methoxyphenyl){[(octylsulfonyl)oxy]imino}acetonitrile, 2-[2,2,3,3,4,4,5,5-octafluoro-1-(nonafluorobutylsulfonyloxyimino)-pentyl]fluorine, bis(p-toluenesulfonyl)diazomethane, methylsulfonyl p-toluenesulfonyldiazomethane, 1-cyclo-hexylsulfonyl-1-(1,1-dimethylethylsulfonyl)diazomethane, bis(1,1-dimethylethylsulfonyl)diazomethane, bis(1-methylethylsulfonyl)diazomethane, bis(cyclohexylsulfonyl)diazomethane, 1-p-toluenesulfonyl-1-cyclohexylcarbonyldiazomethane, 2-methyl-2-(p-toluenesulfonyl)propiophenone, 2-methanesulfonyl-2-methyl-(4-methylthiopropiophenone, 2,4-methyl-2-(p-toluenesulfonyl)pent-3-one, 1-diazo-1-methylsulfonyl-4-phenyl-2-butanone, 2-(cyclohexylcarbonyl-2-(p-toluenesulfonyl)propane, 1-cyclohexylsulfonyl-1cyclohexylcarbonyldiazomethane, 1-diazo-1-cyclohexylsulfonyl-3,3-dimethyl-2-butanone, 1-diazo-1-(1,1-dimethylethylsulfonyl)-3,3-dimethyl-2-butanone, 1-acetyl-1-(1-methylethylsulfonyl)diazomethane, 1-diazo-1-(p-toluenesulfonyl)-3,3-dimethyl-2-butanone, 1-diazo-1-benzenesulfonyl-3,3-dimethyl-2-butanone, 1-diazo-1-(p-toluenesulfonyl)-3-methyl-2-butanone, cyclohexyl 2-diazo-2-(p-toluenesulfonyl)acetate, tert-butyl 2-diazo-2-benzenesulfonylacetate, isopropyl-2-diazo-2-methanesulfonylacetate, cyclohexyl 2-diazo-2-benzenesulfonylacetate, tert-butyl 2 diazo-2-(p-toluenesulfonyl)acetate, 2-nitrobenzyl p-toluenesulfonate, 2,6-dinitrobenzyl p-toluenesulfonate, and 2,4-dinitrobenzyl p-trifluoromethylbenzenesulfonate.

Specific examples of ionic-type photoactive catalysts are triphenyl sulfonium methanesulfonate, triphenyl sulfonium trifluoromethanesulfonate, triphenyl sulfonium hexafluoropropanesulfonate, triphenyl sulfonium nonafluorobutanesulfonate, triphenyl sulfonium perfluorooctanesulfonate, triphenyl sulfonium phenyl sulfonate, triphenyl sulfonium 4-methyl phenyl sulfonate, triphenyl sulfonium 4-methoxyphenyl sulfonate, triphenyl sulfonium 4-chlorophenyl sulfonate, triphenyl sulfonium camphorsulfonate, 4-methylphenyl-diphenyl sulfonium trifluoromethanesulfonate, bis(4-methylphenyl)-phenyl sulfonium trifluoromethanesulfonate, tris-4-methylphenyl sulfonium trifluoromethanesulfonate, 4-tert-butylphenyl-diphenyl sulfonium trifluoromethanesulfonate, 4-methoxyphenyl-diphenyl sulfonium trifluoromethanesulfonate, mesityl-diphenyl sulfonium trifluoromethanesulfonate, 4-chlorophenyl-diphenyl sulfonium trifluoromethanesulfonate, bis(4-chlorophenyl)-phenyl sulfonium trifluoromethanesulfonate, tris(4-chlorophenyl)sulfonium trifluoromethanesulfonate, 4-methylphenyl-diphenyl sulfonium hexafluoropropanesulfonate, bis(4-methylphenyl)-phenyl sulfonium hexafluoropropanesulfonate, tris-4-methylphenyl sulfonium hexafluoropropanesulfonate, 4-tert-butylphenyl-diphenyl sulfonium hexafluoropropane sulfonate, 4-methoxyphenyl-diphenyl sulfonium hexafluoropropane sulfonate, mesityl-diphenyl sulfonium hexafluoropropane sulfonate, 4-chlorophenyl-diphenyl sulfonium hexafluoropropane sulfonate, bis(4-chlorophenyl)-phenyl sulfonium hexafluoropropane sulfonate, tris(4-chlorophenyl) sulfonium hexafluoropropane sulfonate, 4-methylphenyl-diphenyl sulfonium perfluorooctanesulfonate, bis(4-methylphenyl)-phenyl sulfonium perfluorooctanesulfonate, tris-4-methylphenyl sulfonium perfluoroocatanesulfonate, 4-tert-butylphenyl-diphenyl sulfonium perfluorooctane sulfonate, 4-methoxyphenyl-diphenyl sulfonium perfluorooctane sulfonate, mesityl-diphenyl sulfonium perfluorooctane sulfonate, 4-chlorophenyl-diphenyl sulfonium perfluorooctane sulfonate, bis(4-chlorophenyl)-phenyl sulfonium perfluorooctane sulfonate, tris(4-chlorophenyl)sulfonium perfluorooctane sulfonate, diphenyl iodonium hexafluoropropane sulfonate, diphenyl iodonium 4-methylphenyl sulfonate, bis(4-tert-butylphenyl)iodonium trifluoromethane sulfonate, bis(4-tert-butylphenyl)iodonium hexafluoromethane sulfonate, and bis(4-cyclohexylphenyl)iodonium trifluoromethane sulfonate.

Specific examples of catalysts or initiators useful in inducing a combining reaction the presence of heat include but are not limited to organic peroxides such as benzoyl peroxide, diacylperoxides, peroxydicarbonates, alkylperesters, alkyl peroxides, perketals, ketoneperoxides, and alkylhydroperoxides; azo compounds such as azobisisobutyronitrile and 1,1'-azobis(cyclohexanecarbonitrile); and thermal acid generators such as cyclohexyltosylate and K-Cure 1040 from King Industries.

The catalyst or initiator is typically employed in the amounts of about 0.0001 to 20% by weight and more preferably about 1% to 10%. The amount of catalyst or initiator is based on the combined weights of MU and/or other various components.

The photosensitive metal-containing composition may further comprise treated or untreated metal-containing nanoparticles. The metal entity of the nanoparticles and the metal-containing precursor unit (MU) may be different and the ratio of metal atoms to organic atoms is from about 5:1 to about 10:1. The nanoparticles suitable for this application are preferably less than 20 μm in diameter and are compatible with the other components of the photosensitive composition. Examples of such nanoparticles are found in U.S. Pat. Nos. 6,291,070 and 6,844,950.

A few non-limiting examples of metal-containing nanoparticles are surface treated or untreated silica, alumina, titania, zirconia, hafnia, CdSe, CdS, CdTe, CuO, zinc oxide, lanthanum oxide, niobium oxide, tungsten oxide, strontium oxide, calcium titanium oxide, sodium titanate, and potassium niobate.

The photosensitive metal-containing composition may further comprise a prepolymer unit (PU) which contains at least two reactive functional groups. The term prepolymer unit (PU) refers to a monomer unit or an oligomer where oligomer refers to combination of monomer units joined together. The prepolymer may contain many monomer units and is capable of further reactions to be incorporated in the final material. Examples of such monomer units/oligomers are based on one or more of the following types: acrylate, ester, vinyl alcohol, urethane, urea, imide, amide, carbaxazole, carbonate, pyranose, siloxane, urea-formaldehyde and melamine-formaldehyde. The PU contains at least two terminal and/or pendant reactive functional groups. These can participate in combining reactions with metal-containing precursor units (MU). Examples of such terminal and pendant groups are a vinyl group, an allyl group, a (meth)acryloyl group, an epoxy group, a SiH group and a —SH group. An important criterion in the selection of the MU and the PU for the metal containing composition of this embodiment is that they are compatible with each other.

Specific examples of prepolymer unit (PU) include urethane acrylate oligomer. The term urethane acrylate oligomer refers to a class of compounds that contain urethane linkages and have (meth)acrylate functional groups such as urethane multi(meth)acrylate, multiurethane(meth)acrylate, and multiurethane multi(meth)acrylate. Types of urethane(meth)acrylate oligomers have been described by Coady et al. in U.S. Pat. No. 4,608,409 and by Chisholm et al. in U.S. Pat. No. 6,844,950 and are incorporated herein as references. Other specific examples of prepolymer unit (PU) include 1,6-hexanediol di(meth)acrylate, tetraethyleneglycol di(meth)acrylate, divinylbenzene, ethoxylated bisphenol-A-di(meth)acrylate, diethylene glycol bis(allyl carbonate), trimethylolpropane tri(meth)acrylate, ditrimethylolpropane tetra(meth)acrylate, pentaerythritol tri(meth)acrylate, pentaerythritol tetra(meth)acrylate, dipentaerythritol penta-/hexa-(meth)acrylate, isocyanurate tri(meth)acrylate, bis(2-hydroxyethyl)-isocyanurate di(meth)acrylate, 1,3-butanediol tri(meth)acrylate, 1,4-butanediol tri(meth)acrylate, neopentyl glycol di(meth)acrylate, (meth)acrylate modified-urea-formaldehyde, melamine-formaldehydecellulose and siloxanes having vinyl, allyl, (meth)acryloyol, or hydro-silane terminal or pendent functional groups. Specific examples of such siloxane prepolymer units include vinyl-, epoxide- or (meth)acryl-terminated polyhedyrl oligomeric silsesquioxanes (POSS) (Hybrid Plastics codes OL1160, EP0409, MA0735 and MA0736), vinyl-terminated polydimethylsiloxanes (CAS 68083-19-2), vinyl terminated diphenylsiloxane-dimethylsiloxane copolymer (CAS 68951-96-2), vinyl terminated polyphenylmethylsiloxane (CAS 225927-21-9), vinyl terminated diethylsiloxane-dimethylsiloxane copolymer (Gelest Code EDV-2025), vinylmethylsiloxane-dimethylsiloxane copolymers, trimethylsiloxy terminated (CAS 67762-94-1), vinylmethylsiloxane-dimethylsiloxane copolymers, vinyl terminated (CAS 68083-18-1), vinylmethylsiloxane-homopolymers (Gelest Code VMS-005 and VMS-T11). Vinyl T-structured polymers (Gelest Code VTT-106 and MTV-124), vinylmethylsiloxane terpolymers (CAS 597543-32-3), vinylmethoxysiloxane homopolymer (CAS 131298-48-1), vinylethoxysiloxane homopolymer (CAS 29434-25-1), vinyl-propylethoxysiloxane copolymer (Gelest Code VPE-005), hydride terminated poly-dimethyl siloxanes (CAS 70900-21-9), methylhydrosiloxane-dimethylsiloxane copolymers, trimethylsiloxy terminated (CAS 68037-59-2), methylhydrosiloxane-dimethylsiloxane copolymers, hydride terminated (CAS 69013-23-6), polymethylhydrosiloxanes, trimethylsiloxy terminated (CAS 63148-57-2), polyethylhydrosiloxane, triethylsiloxy terminated (CAS 24979-95-1), polyphenyl-(dimethylhydroxysiloxy)siloxane, hydride terminated (Gelest Code HDP-111) and hydride Q resin (CAS 68988-57-8).

The prepolymer often has an average molecular weight between 70 and $10^7$ Daltons. A more preferred upper limit of molecular weight is $10^6$ Daltons. The most preferred upper limit of molecular weight is $10^5$ Daltons.

The photosensitive metal-containing composition may further comprise a suitable solvent. The choice of solvent for the formulation and the concentration thereof depends principally on the type of functionalities incorporated in the metal-containing precursor unit (MU) and/or other various components along with the photoactive catalyst or photoinitiator and the coating method. The solvent should be inert, should dissolve or uniformly disperse all the components in the composition, should not undergo any chemical reaction with the components, and should be removable on drying after coating. Suitable solvents for the composition may include non-aqueous solvents such as ketones, ethers, esters and alcohols. Examples of ketones, ethers, and esters include 2-butanone, 3-methyl-2-butanone, 2-heptanone, cyclopentanone, cyclohexanone, 2-methoxy-1-propylene acetate, 2-methoxyethanol, 2-ethoxyethanol, 2-ethoxyethyl acetate, 1-methoxy-2-propyl acetate, 1,2-dimethoxy ethane ethyl acetate, cellosolve acetate, methyl lactate, ethyl lactate, n-butyl acetate, methyl pyruvate, ethyl pyruvate, methyl 3-methoxypropionate, ethyl 3-methoxypropionate, N-methyl-2-pyrrolidone, 1,4-dioxane, ethylene glycol monoisopropyl ether, diethylene glycol monoethyl ether, diethylene glycol monomethyl ether, diethylene glycol dimethyl ether, and the like. Examples of alcohol solvents include methanol, ethanol, 1-propanol, 2-propanol, butanol, and the like.

The photosensitive metal-containing composition of the process may further comprise conventional additives, such as dyes, surface active agents, adhesion promoters, viscosity modifiers, buffers, sensitizers, stabilizers, anti-oxidants, colorants, dyes, pigments and surfactants. Similarly, a dye may be used to improve the sensitivity of the coating to actinic light.

The photosensitive metal-containing composition may further comprise organic monomer containing one reactive functional group or a polymer. For instance, acrylate monomer or vinyl ether may be used to improve the physical properties of the final film such as viscosity. The acrylate monomer or vinyl ether is incorporated into the film or article by combining reactions with MU and/or other various components.

The process described in the above embodiments comprises formulating by mixing appropriate proportions of different components used in the photosensitive metal-containing composition until a homogeneous solution is obtained. The components are mixed in a clean container which can block UV light. The solutions are filtered through appropriate filter media such as PTFE, nylon, polypropylene, surface treated polyethylene or polypropylene, etc. The nominal pore size of the filter media is <5 μm.

The photosensitive metal-containing composition is uniformly coated onto a suitable substrate, such as metal, plastic, wood, paper, glass, ceramic and semiconducting materials including silicon, gallium arsenide, etc. The substrate may be planar, patterned or 3-dimensional. The coatings may be applied by dipping (or dip coating), knife coating, lamination, brushing, spraying, spin-coating, die coating, micro-gravure coating, cast-transfer or reverse-roll coating. The composition may also be applied by drop-dispense techniques where only a small amount of the composition is applied in a specified area.

After applying the photosensitive metal-containing composition to a substrate, the process of the above embodiments further comprises a drying step is employed to drive off any organic solvent or other volatile materials to form a uniform defect-free coating. An example of a drying step is heating at a temperature is in the range of about 40° C. to 200° C. for about a few seconds to a few minutes.

After applying the photosensitive metal-containing composition to a substrate and drying the photosensitive metal-containing composition, the process of the above embodiments further comprises exposing the photosensitive metal-containing composition to actinic radiation source. When the photosensitive metal-containing composition is exposed to actinic radiation, the photoactive catalyst or photoinitiator induces combining reactions of reactive functional groups on the metal-containing precursor unit renders the exposed region of the composition insoluble in solvent, leaving the unexposed portion of the composition soluble. An example of actinic radiation is light (broadband or specific wavelength from about 0.01 nm to about 600 nm). Examples of actinic light sources include high pressure mercury lamp, excimer lasers, electron beam, and x-ray sources.

Total exposure time vary from about 5 seconds to 30 minutes depending on intensity of the radiation, thickness and nature of the photosensitive metal-containing composition and sensitivity of the photoactive catalyst or photoinitiator used. The composition may be exposed to radiation whether it is in a solvent-containing state or in a solvent-free state after evaporating the solvent fraction.

The process described in the second embodiment comprises exposing the photosensitive metal-containing composition to actinic radiation through an appropriate photomask. A photomask is an opaque substrate with transparent patterns such as holes, lines, and spaces that allow light to shine through. An example of a photomask is a transparent fused silica, calcium fluoride or magnesium fluoride blank covered with a chrome pattern.

After applying the photosensitive metal-containing composition to a substrate, drying the photosensitive metal-containing composition and exposing of the photosensitive metal-containing composition to actinic radiation, the next step in the process described in the second embodiment comprises developing of the unexposed portion of the composition by applying a suitable solvent. The unexposed regions of the composition are soluble in solvent and dissolve away, leaving a pattern. The solvent may be applied to the substrate by spraying, dipping or puddling. The total contact time with the solvent can vary from a few seconds to a few minutes. The time needed to dissolve unexposed regions of the composition would determine the suitable solvent. Suitable solvents for developing the unexposed regions of the composition may be selected invidually or in combination from non-aqueous solvents such as ketones, ethers, esters and alcohols as well as aqueous alkaline and aqueous acidic solutions. Examples of ketones, ethers, and esters include 2-butanone, 3-methyl-2-butanone, 2-heptanone, cyclopentanone, cyclohexanone, 2-methoxy-1-propylene acetate, 2-methoxyethanol, 2-ethoxyethanol, 2-ethoxyethyl acetate, 1-methoxy-2-propyl acetate, 1,2-dimethoxy ethane ethyl acetate, cellosolve acetate, methyl lactate, ethyl lactate, n-butyl acetate, methyl pyruvate, ethyl pyruvate, methyl 3-methoxypropionate, ethyl 3-methoxypropionate, N-methyl-2-pyrrolidone, 1,4-dioxane, ethylene glycol monoisopropyl ether, diethylene glycol monoethyl ether, diethylene glycol monomethyl ether, diethylene glycol dimethyl ether, and the like. Examples of alcohol solvents include methanol, ethanol, 1-propanol, 2-propanol, butanol, and the like.

After the development step, any residual solvent and other volatile components may be removed by applying a drying step. Examples of a drying step include spin-drying or at temperature in the range of about 40° C. to 200° C. for about a few seconds to a few minutes.

After applying the photosensitive metal-containing composition to a substrate, drying the photosensitive metal-containing, exposing of the photosensitive metal-containing composition to actinic radiation and developing the unexposed portion of the composition, the next step in the process described in the above embodiments further comprises applying a post-treatment selected individually or in combination from a thermal, chemical or plasma treatment. The resulting metal-containing film, article or three-dimensional object comprises $M_zE_v$, where M is metal as described in Structure I; E is selected individually or in combination from a group of elements such as oxygen, hydrogen, nitrogen, sulfur, carbon, silicon or fluorine; where z is about 5 to about 95% and z+v is 100%. In some cases the post-treatment results in a change of refractive index for the metal-containing film, article or three-dimensional object of at least about ±0.1, or a refractive index change of at least about ±0.2 or refractive index change of at least about ±0.25. The process including a post-treatment produces metal-containing films, articles or three-dimensional objects with index of refraction in the range of 1.4 to 2.2 in the 400-900 nm range of light and 1.4 to 2.4 in the 150-400 nm range of light. The process also provides metal-containing films, three-dimensional objects or articles with dielectric constant of at least 2.

Non-limiting examples of thermal treatment involve elevated temperatures (typically greater than 200° C.) to the metal-containing compositions in vacuum or in the presence of a suitable atmosphere such as air, oxygen, nitrogen, etc.

One non-limiting example of a chemical treatment is employing ozone treatment.

One non-limiting example of a plasma treatment is employing oxygen plasma.

The embodiments described herein also include a metal-containing film, three-dimensional object or article formed by the photosensitive metal-containing compositions and the processes described above.

The disclosed embodiments also include a coated, a laminated, or a molded article formed by the photosensitive metal-containing compositions and the processes described above.

The disclosed embodiments further include a microdevice formed by the photosensitive metal-containing compositions and the processes described above.

EXAMPLES

The metal-containing precursor unit (MU) for each example was prepared as described in copending U.S. patent application Ser. No. 11/792,738 and U.S. patent application Ser. No. 11/792,739, the contents of which are incorporated herein by reference in their entirety.

Comparative Example 1

The following example compares materials used in solgel and CVD technology using the process.

Sample Preparation: A solution of zirconium n-butoxide (80 wt % in n-butanol from Sigma-Aldrich Corp.) was diluted to 25 wt % with n-butanol. The resulting mixture was homogeneous after stirring. The homogeneous and clear solution was filtered through a 1.0 µm PTFE syringe filter. The solution was spin-coated onto a 1" silicon wafers at wet coating thickness of about 1.2 µm and dried for 60 seconds at 130° C. on a hotplate.

The coating became opaque white powder that easily flaked off the substrate. The coating quality demonstrates that zirconium n-butoxide would not be stable for the subsequent steps of the process and is therefore an unsuitable material for this process.

Examples 1-14

The following examples demonstrate photosensitivity of the photosensitive metal-containing compositions by comparing the material with and without photoinitiator.

Sample Preparation: Each solution was prepared by dissolving the metal-containing precursor unit (MU) in the solvent or solvent combination as listed in Table 1 (15 wt % in solution). The examples with photoinitiator contain 8.8 wt % (based on weight of MU) of 1-hydroxy-cyclohexyl-phenyl-ketone, Irgacure 184 from Ciba Specialty Chemicals and 1.2 wt % (based on weight of MU) of bis(2,4,6-trimethylbenzoyl)-phenylphosphineoxide, Irgacure 819 from Ciba Specialty Chemicals. The resulting mixture was homogeneous after stirring. The homogeneous solution was filtered through a 1.0 µm PTFE syringe filter. These solutions were used in the IR and Solubility Tests.

IR Test: The solutions prepared above were individually tested by applying to a 1" NaCl plate and drying for 30 seconds with a heat gun. Each dried composition was analyzed by an infrared spectrometer between 4000 and 600 $cm^{-1}$. The dried composition was exposed by a Blak-ray UV lamp Model 100 AP for 15 minutes and analyzed by an infrared spectrometer for changes in C=C stretch at 1640 $cm^{-1}$.

Solubility Test: The solutions prepared above were individually tested by coating onto a Luminor T PET film from Toray (75 µm thick) with a wire-wound coater (3 mil diameter), Catalog No. AR-4103 from BYK Gardner to a wet coating thickness of about 5 µm and drying for 60 seconds at 80° C. in an oven. Each dried composition was exposed by a Blak-ray UV lamp Model 100 AP for 15 minutes. The solubility of the resulting composition was determined by mechanically rubbing a cotton swab soaked in acetone. The data are shown in Table 1.

TABLE 1

| Ex. | MU | Initiator | Solvent | IR Analysis | Solubility Test |
|---|---|---|---|---|---|
| 1 | Hafnium Acrylate | Yes | 1-Methoxy-2-propanol | Peak at 1640 cm−1 reduced | Insoluble |
| 2 | Hafnium Acrylate | No | 1-Methoxy-2-propanol | No change | Soluble |
| 3 | Hafnium Carboxyethyl Acrylate | Yes | 1-Methoxy-2-propanol/n-Butanol | Peak at 1640 cm−1 reduced | Insoluble |
| 4 | Hafnium Carboxyethyl Acrylate | No | 1-Methoxy-2-propanol/n-Butanol | No change | Soluble |
| 5 | Zirconium Carboxyethyl Acrylate | Yes | 1-Methoxy-2-propanol/n-Propanol | Peak at 1640 cm−1 reduced | Insoluble |
| 6 | Zirconium Carboxyethyl Acrylate | No | 1-Methoxy-2-propanol/n-Propanol | No change | Soluble |
| 7 | Zirconium 2-bromo-5-oxo-4-oxatricyclo[4.2.1.0$^{3,7}$]nonane-9-carboxylate triacrylate | Yes | 1-Methoxy-2-propanol | Peak at 1640 cm−1 reduced | Insoluble |
| 8 | Zirconium 2-bromo-5-oxo-4-oxatricyclo[4.2.1.0$^{3,7}$]nonane-9-carboxylate triacrylate | No | 1-Methoxy-2-propanol | No change | Soluble |
| 9 | Zirconyl Dimethacrylate | Yes | 1-Methoxy-2-propanol | Peak at 1640 cm−1 reduced | Insoluble |
| 10 | Zirconyl Dimethacrylate | No | 1-Methoxy-2-propanol | No change | Soluble |
| 11 | Zirconium Acrylate | Yes | 1-Methoxy-2-propanol | Peak at 1640 cm−1 reduced | Insoluble |
| 12 | Zirconium Acrylate | No | 1-Methoxy-2-propanol | No change | Soluble |
| 13 | Zirconium Carboxyethyl Acrylate with Acryl-terminated POSS | Yes | 1-Methoxy-2-propanol/n-Propanol | Peak at 1640 cm−1 reduced | Insoluble |
| 14 | Zirconium Carboxyethyl Acrylate with Acryl-terminated POSS | No | 1-Methoxy-2-propanol/n-Propanol | No change | Soluble |

The results of Table 1 indicate that the MU of these embodiments is not photosensitive as confirmed by no change in the IR spectra of the compositions before and after exposure when no photoinitiator was used. On the contrary, a significant change in their IR and solubility characteristics was observed when MU was used in combination with photoinitiator. Combining reactions of the reactive functional groups led to change in solubility as also confirmed by the reduction of 1640 cm$^{-1}$ peak intensity in their IR spectra.

Examples 15-16

The following examples demonstrate formation of a metal-containing film through the process of applying a photosensitive metal-containing composition on steel or tungsten, drying the photosensitive metal-containing composition, exposing the photosensitive metal-containing composition to a source of UV light and applying a thermal treatment to produce a metal-containing film.

Sample Preparation: A solution was prepared by dissolving hafnium carboxyethyl acrylate (25 wt %) in 2-butanone/n-butanol (75:25). The the solution was added 10 wt % of 1-hydroxy-cyclohexyl-phenyl-ketone, Irgacure 184 from Ciba Specialty Chemicals. The resulting mixture was homogeneous after stirring. The homogeneous and clear solution was filtered through a 1.0 μm PTFE syringe filter. Each solution was dip-coated onto metal coupons that are 0.5"×1" and dried for 120 seconds at 120° C. on a hotplate. Each coupon was exposed by a Blak-ray UV lamp Model 100 AP for 15 minutes. Each coupon was thermally treated at 250° C. for 30 minutes in an oven then heated to a higher temperature for 60 minutes. The type of metal coupon used, the final temperature of the thermal treatment and metal content as measured by Energy Dispersive X-ray Spectroscopy are listed in Table 2.

TABLE 2

| Ex. | Type of Coupon | Final Bake T (° C.) | Hf (wt %) | O (wt %) | C (wt %) |
|---|---|---|---|---|---|
| | Initial film composition | | 24 | 34 | 38 |
| 15 | Steel | 600 | 77 | 17 | 6 |
| 16 | Tungsten | 600 | 84 | 16 | 0 |

The results of Table 2 indicate that the process of applying a photosensitive metal-containing composition on steel or tungsten, drying the photosensitive metal-containing composition, exposing the photosensitive metal-containing composition to a source of UV light and applying a thermal treatment forms a metal-containing film with a hafnium content of 77-84%. This is an example of $M_zE_v$ where M is hafnium, E is a combination of oxygen and carbon, z is 77-84% and z+v is 100%.

Examples 17-18

The following examples demonstrate producing metal-containing films with index of refraction in the range of 1.4 to 2.2 in the 400-900 nm range of through the process of applying a photosensitive metal-containing composition on silicon, drying the photosensitive metal-containing composition, exposing the photosensitive metal-containing composition to a source of UV light and applying a thermal treatment.

Sample Preparation: Each solution was prepared by dissolving the metal-containing precursor unit (MU) in the solvent or solvent combination as listed in Table 3 (25 wt % in solution). To each solution was added 10 wt % (based on weight of MU) of 1-hydroxy-cyclohexyl-phenyl-ketone, Irgacure 184 from Ciba Specialty Chemicals. The resulting mixture was homogeneous after stirring. The homogeneous and clear solution was filtered through a 0.2 μm PTFE syringe filter. Each solution was spin-coated onto four 1" silicon wafers at wet composition thickness of about 2.6 μm and dried for 60 seconds at 100° C. on a hotplate. Each wafer was exposed by a Blak-ray UV lamp Model 100 AP for 15 minutes. For each solution, one of the exposed wafers was heated to 300° C. for one hour in an oven, another exposed wafer was heated to 400° C. for one hour in an oven, a third exposed wafer was heated to 500° C. for one hour in an oven, and a fourth exposed wafer was heated to 600° C. for one hour in an oven. The refractive index and film thickness of each wafer were measured on a Gaertner Ellipsometer at 633 nm and 830 nm are listed in Table 3.

TABLE 3

| Ex. | MU | Solvent | Bake Temperature (° C.) | n at 633 nm | n at 830 nm | Film Thickness (μm) |
|---|---|---|---|---|---|---|
| 17 | Zirconium Carboxyethyl Acrylate | 2-Butanone/n-Butanol | No Bake | 1.580 | 1.550 | 2.6 |
| | | | 300 | 1.750 | 1.710 | 2.3 |
| | | | 400 | 1.880 | 1.830 | 2.0 |
| | | | 500 | 1.825 | 1.785 | 2.0 |
| | | | 600 | 1.745 | 1.705 | 2.0 |
| 18 | Hafnium Carboxyethyl Acrylate | 2-Butanone/n-Butanol | No Bake | 1.550 | 1.520 | 2.5 |
| | | | 300 | 1.695 | 1.655 | 2.3 |
| | | | 400 | 1.805 | 1.760 | 2.0 |
| | | | 500 | 1.770 | 1.725 | 2.0 |
| | | | 600 | 1.680 | 1.645 | 2.0 |

The results of Table 2 indicate that the process of applying a photosensitive metal-containing composition on silicon, drying the photosensitive metal-containing composition, exposing the photosensitive metal-containing composition to a source of UV light and applying a thermal treatment successfully produces metal-containing films with index of refraction in the range of 1.4 to 2.2 in the 400-900 nm range.

Examples 19-23

The following examples demonstrate the capability of the photosensitive metal-containing composition to form patterns through process of applying a photosensitive metal-containing composition on silicon, drying the photosensitive metal-containing composition, exposing the photosensitive metal-containing composition to UV light through a mask, developing the unexposed portions of the composition with solvent and applying a thermal treatment successfully produces metal-containing three-dimensional objects.

Sample Preparation: Each solution was prepared by dissolving the metal-containing precursor unit (MU) in the solvent or solvent combination as listed in Table 4 (15 wt % in solution). To each solution was added 8.8 wt % (based on weight of MU) of 1-hydroxy-cyclohexyl-phenyl-ketone, Irgacure 184 from Ciba Specialty Chemicals and 1.2 wt % (based on weight of MU) of bis(2,4,6-trimethylbenzoyl)-phenylphosphineoxide, Irgacure 819 from Ciba Specialty Chemicals. The resulting mixture was homogeneous after stirring. The homogeneous and clear solution was filtered through a 0.2 μm PTFE syringe filter. The solution was spin-coated onto a 2" silicon wafer a wet thickness of about 5 μm and dried for 60 seconds at 100° C. on a hotplate. This dried composition was exposed through a binary photomask with feature sizes 40 to 5 μm by a Blak-ray UV lamp Model 100 AP for 15 minutes. The unexposed regions of the composition were developed away by rinsing with acetone for 60 seconds. The patterned wafer was heated to 200° C. for 5 minutes. The patterned wafer was examined under a microscope set from 500 to 10,000× magnification.

TABLE 4

| Ex. | MU | Solvent | Resolution |
|---|---|---|---|
| 19 | Hafnium Carboxyethyl Acrylate | 1-Methoxy-2-propanol/n-Butanol | 5 μm |
| 20 | Zirconium Carboxyethyl Acrylate | 1-Methoxy-2-propanol/n-Propanol | 5 μm |
| 21 | Hafnium Carboxyethyl Acrylate/ Zirconium Carboxyethyl Acrylate | 1-Methoxy-2-propanol/n-Butanol/n-Propanol | 5 μm |
| 22 | Zirconium 6-(2-naphthylthio) bicyclo[2.2.1] heptane-2-carboxylate triacrylate | 1-Methoxy-2-propanol | 5 μm |
| 23 | Zirconium Carboxyethyl Acrylate Acryl-terminated POSS | 1-Methoxy-2-propanol/n-propanol | 5 μm |

The term resolution as used on Table 4 refers to the smallest feature size on the mask that can be printed on the substrate. In this particular case, 5 μm was the smallest feature size available on the photomask used for the purpose of generating these examples. It is expected that smaller than 5 μm size features can be printed by using appropriate mask and wavelength of the actinic radiation used. Examples 19 to 23 show that the process of applying a photosensitive metal-containing composition on silicon, drying the photosensitive metal-containing composition, exposing the photosensitive metal-containing composition to UV light through a mask and developing the unexposed portions of the composition with solvent successfully produces metal-containing three-dimensional objects.

Examples 19 and 20 were post-treated at 400° C. for 60 minutes. The patterned features were retained as seen under microscope showing that the process of applying a photosensitive metal-containing composition on silicon, drying the photosensitive metal-containing composition, exposing the photosensitive metal-containing composition to UV light through a mask and developing the unexposed portions of the composition with solvent and applying a thermal treatment successfully produces metal-containing three-dimensional objects.

What is claimed is:

1. A directly patterned metal-containing film, article or object formed by the process comprising:
   a. applying a photosensitive metal-containing composition on a substrate wherein the photosensitive metal-containing composition comprises:
      i. a metal-containing precursor unit (MU) containing at least two reactive functional groups, and
      ii. a photoinitiator or photoactive catalyst
   where MU is represented by Structure I:

$MA_wB_xC_y$  Structure I where M comprises a metal with a formal valency of 0-7 and is selected from Zr, Hf, Ge, Ti, Pb, Gd, Sn, Zn, Ni, Ce, Nb, Eu, In, Al, Fe, Mn, Nd, Cu, Sb, Mg, Ga, Se, Cd, Ta, Co, Cr, Pt, Au, W, V, Tl, Te, Sr, Sm, La, Er, Pd, In, Ca, Ba, As and Y; Ligand A contains a reactive functional group capable of undergoing a combining reaction; w is 2 to 7; Ligands B and C are selected individually or in combination from oxygen, nitrogen, sulfur, or a halogen atom; linear, branched or cyclic alkyl, alkenyl or alkynyl group; substituted or unsubstituted aryl group; and —$XR^1$ where X represents an organic functional group such as oxy, thio, carboxy, thiocarboxy, sulfo, oxalate, acetoacetonate, carbanion, carbonyl, thiocarbonyl, cyano, nitro, nitrito, nitrate, nitrosyl, azide, cyanato, isocyanato, thiocyanato, isothiocyanato, amido, amine, diamine, arsine, diarsine, phosphine, and diphosphine, and $R^1$ represents a linear, branched or cyclic alkyl or thioalkyl group, a heterocyclic group, an alicyclic group, and a substituted or unsubstituted aryl or heteroaryl group; and x and y are 0 to 5,
   b. drying the photosensitive metal-containing composition at a temperature less than 200° C.,
   c. exposing the photosensitive metal-containing composition to a source of actinic radiation through a mask or a mold followed by development of the unexposed portion of the composition and
   d. applying to the metal-containing composition a post-treatment selected individually or in combination from thermal, source of high energy ion beam, chemical and plasma.

2. The directly patterned metal-containing film, article or object of claim 1 wherein the post-treatment is a thermal treatment greater than 250° C.

3. The directly patterned metal-containing film, article or object of claim 1 wherein the unexposed portion of the composition is developed with a solvent based developer.

4. The directly patterned metal-containing film, article or object of claim 1, wherein Ligand A of the metal-containing precursor unit comprises at least one member selected from the group consisting of acrylate, methacrylate, styryl, vinyl, allyl, cyclo-olefin and epoxide.

5. The directly patterned metal-containing film, article or object of claim 1 wherein the photosensitive metal-containing composition further comprises a nanoparticle selected individually or in combination from surface treated or untreated silica, alumina, titania, zirconia, hafnia, CdSe, CdS, CdTe, CuO, zinc oxide, lanthanum oxide, niobium oxide, tungsten oxide, strontium oxide, calcium titanium oxide, sodium titanate, and potassium niobate.

6. The directly patterned metal-containing film, article or object of claim 1 wherein the photosensitive metal-containing composition further comprises a prepolymer unit, PU, which contains at least two reactive functional groups.

7. The directly patterned metal-containing film, article or object of claim 1 wherein the photosensitive metal-containing composition further comprises a prepolymer unit, PU, which contains at least two reactive functional groups wherein at least one group is at least one member selected from the group consisting of —SiH group and —SH group.

8. The directly patterned metal-containing film, article or object of claim 1 wherein the photosensitive metal-containing composition further comprises a co-monomer with one reactive functional group.

9. The directly patterned metal-containing film, article or object of claim 1 wherein the photosensitive metal-containing composition further comprises a co-monomer with at least one member selected from the group consisting of —SiH group and —SH group.

10. The directly patterned metal-containing film, article or object of claim 1 wherein the photosensitive metal-containing composition further comprises a solvent.

11. The directly patterned metal-containing film, article or object of claim 1 wherein the photosensitive metal-containing composition further comprises an additive.

12. The directly patterned metal-containing film, article or object of claim 1 comprising $M_zE_v$ where E is selected individually or in combination from a group of elements such as oxygen, hydrogen, nitrogen, sulfur, carbon, silicon or fluorine; where z is about 5 to about 95% and z+v is 100%.

13. The directly patterned metal-containing film, article or object of claim 1 having an index of refraction in the range of 1.5 to 2.2 in the 400-900 nm range of light and 1.5 to 2.4 in the 150-400 nm range of light.

14. The directly patterned metal-containing film, article or object of claim 1, wherein Ligand A of the metal-containing precursor unit comprises at least one member selected from the group consisting of —SiH group and —SH group.

15. The directly patterned metal-containing film, article or object of claim 1 wherein the photoinitiator or photoactive catalyst comprises at least one member selected from the group consisting of 1-hydroxy-cyclohexyl-phenyl-ketone, 2-hydroxy-2-phenylpropan-1-one, benzophenone, 2,4,4-trimethylpentyl phosphine oxide, 2,2-dimethoxy-2-acetophenone, bis(2,4,6-trimethyl benzoyl)phenyl-phosphine oxide, 2-methyl-1-[4-(methylthio)phenyl]-2-morphorinopropane-1-on, (2,4,6-trimethoxybenzoyl)diphenyl phosphine oxide, 2-hydroxy-2-methyl-1-phenylpropane-1-on, 2-chlorothioxanthone, 2-methylthioxanthone, 2-isopropylthioxanthone, benzodimethyl ketal, 1,1,1-trichloroacetophenone, diethoxyacetophenone, m-chloroacetophenone, propiophenone, anthraquinone, and dibenzosuberone.

16. The directly patterned metal-containing film, article or object of claim 1 having a dielectric constant of at least 2.

17. The directly patterned metal-containing film, article or object of claim 1 wherein the directly patterned metal-containing film, article or object is contained in a microdevice.

18. A metal-containing film, article or object comprising: $M_zE_v$ where M comprises a metal with a formal valency of 0-7 and is selected from Zr, Hf, Ge, Ti, Pb, Gd, Sn, Zn, Ni, Ce, Nb, Eu, In, Al, Fe, Mn, Nd, Cu, Sb, Mg, Ga, Se, Cd, Ta, Co, Cr, Pt, Au, W, V, Tl, Te, Sr, Sm, La, Er, Pd, In, Ca, Ba, As and Y; E is selected individually or in combination from a group of elements such as oxygen, hydrogen, nitrogen, sulfur, carbon, silicon or fluorine; and z is about 5 to about 95% and z+v is 100%, wherein $M_zE_v$ is formed by a process comprising:

a. applying a photosensitive metal-containing composition on a substrate wherein the photosensitive metal-containing composition comprises:
   i. a metal-containing precursor unit (MU) containing at least two reactive functional groups, and
   ii. a photoinitiator or photoactive catalyst
where MU is represented by Structure I:

$$MA_wB_xC_y \qquad \text{Structure I}$$

where Ligand A contains a reactive functional group capable of undergoing a combining reaction; w is 2 to 7; Ligands B and C are selected individually or in combination from oxygen, nitrogen, sulfur, or a halogen atom; linear, branched or cyclic alkyl, alkenyl or alkynyl group; substituted or unsubstituted aryl group; and —XR$^1$ where X represents an organic functional group such as oxy, thio, carboxy, thiocarboxy, sulfo, oxalate, acetoacetonate, carbanion, carbonyl, thiocarbonyl, cyano, nitro, nitrito, nitrate, nitrosyl, azide, cyanato, isocyanato, thiocyanato, isothiocyanato, amido, amine, diamine, arsine, diarsine, phosphine, and diphosphine, and R$^1$ represents a linear, branched or cyclic alkyl or thioalkyl group, a heterocyclic group, an alicyclic group, and a substituted or unsubstituted aryl or heteroaryl group; and x and y are 0 to 5, b. drying the photosensitive metal-containing composition at a temperature less than 200° C.,
c. exposing the photosensitive metal-containing composition to a source of actinic radiation and
d. applying to the metal-containing composition a post-treatment selected individually or in combination from thermal, source of high energy ion beam, chemical and plasma.

19. The metal-containing film, article or object of claim 18 having an index of refraction in the range of 1.5 to 2.2 in the 400-900 nm range of light and 1.5 to 2.4 in the 150-400 nm range of light.

20. The metal-containing film, article or object of claim 18 having a dielectric constant of at least 2.

21. The metal-containing film, article or object of claim 18 wherein the post-treatment is a thermal treatment greater than 250° C.

22. The metal-containing film, article or object of claim 18, wherein Ligand A of the metal-containing precursor unit comprises at least one member selected from the group consisting of acrylate, methacrylate, styryl, vinyl, allyl, cycloolefin and epoxide.

23. The metal-containing film, article or object of claim 18 wherein the photosensitive metal-containing composition further comprises a nanoparticle selected individually or in combination from surface treated or untreated silica, alumina, titania, zirconia, hafnia, CdSe, CdS, CdTe, CuO, zinc oxide, lanthanum oxide, niobium oxide, tungsten oxide, strontium oxide, calcium titanium oxide, sodium titanate, and potassium niobate.

24. The metal-containing film, article or object of claim 18 wherein the photosensitive metal-containing composition further comprises a prepolymer unit, PU, which contains at least two reactive functional groups.

25. The metal-containing film, article or object of claim 18 wherein the photosensitive metal-containing composition further comprises a prepolymer unit, PU, which contains at least two reactive functional groups wherein at least one group is at least one member selected from the group consisting of —SiH group and —SH group.

26. The metal-containing film, article or object of claim 18 wherein the photosensitive metal-containing composition further comprises a co-monomer with one reactive functional group.

27. The metal-containing film, article or object of claim 18 wherein the photosensitive metal-containing composition further comprises a co-monomer with at least one member selected from the group consisting of —SiH group and —SH group.

28. The metal-containing film, article or object of claim 18 wherein the photosensitive metal-containing composition further comprises a solvent.

29. The metal-containing film, article or object of claim 18 wherein the photosensitive metal-containing composition further comprises an additive.

30. The metal-containing film, article or object of claim 18, wherein Ligand A of the metal-containing precursor unit comprises at least one member selected from the group consisting of —SiH group and —SH group.

31. The metal-containing film, article or object of claim 18 wherein the photoinitiator or photoactive catalyst comprises at least one member selected from the group consisting of 1-hydroxy-cyclohexyl-phenyl-ketone, 2-hydroxy-2-phenyl-propan-1-one, benzophenone, 2,4,4-trimethylpentyl phosphine oxide, 2,2-dimethoxyl-2-acetophenone, bis(2,4,6-trimethyl benzoyl)phenyl-phosphine oxide, 2-methyl-1-[4-(methylthio)phenyl]-2-morphorinopropane-1-on, (2,4,6-trimethoxybenzoyl)diphenyl phosphine oxide, 2-hydroxy-2-methyl-1-phenylpropane-1-on, 2-chlorothioxanthone, 2-methylthioxanthone, 2-isopropylthioxanthone, benzodimethyl ketal, 1,1,1-trichloroacetophenone, diethoxyacetophenone, m-chloroacetophenone, propiophenone, anthraquinone, and dibenzosuberone.

32. The metal-containing film, article or object of claim 18 wherein the metal-containing film, article or object is contained in a microdevice.

* * * * *